(12) United States Patent
Sakamoto

(10) Patent No.: US 9,343,554 B2
(45) Date of Patent: May 17, 2016

(54) SEMICONDUCTOR DEVICE AND MANUFACTURING METHOD OF THE SAME

(71) Applicant: ASAHI KASEI MICRODEVICES CORPORATION, Tokyo (JP)

(72) Inventor: Toshiro Sakamoto, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 14/769,882

(22) PCT Filed: Feb. 24, 2014

(86) PCT No.: PCT/JP2014/000960
§ 371 (c)(1),
(2) Date: Aug. 24, 2015

(87) PCT Pub. No.: WO2014/132616
PCT Pub. Date: Sep. 4, 2014

(65) Prior Publication Data
US 2016/0005840 A1    Jan. 7, 2016

(30) Foreign Application Priority Data

Feb. 28, 2013 (JP) ................................. 2013-039188

(51) Int. Cl.
*H01L 29/66* (2006.01)
*H01L 21/28* (2006.01)
*H01L 29/737* (2006.01)

(52) U.S. Cl.
CPC ...... *H01L 29/7378* (2013.01); *H01L 29/66242* (2013.01); *H01L 21/28* (2013.01)

(58) Field of Classification Search
CPC . H01L 21/331; H01L 21/28; H01L 29/66242; H01L 29/0615; H01L 29/1004; H01L 29/737; H01L 29/417
See application file for complete search history.

(56) References Cited

U.S. PATENT DOCUMENTS

| | | | |
|---|---|---|---|
| 5,654,209 A * | 8/1997 | Kato | H01L 21/22 257/E21.004 |
| 2004/0065942 A1* | 4/2004 | Trogolo | H01L 21/82285 257/565 |

(Continued)

FOREIGN PATENT DOCUMENTS

| | | |
|---|---|---|
| JP | H01-243582 A | 9/1989 |
| JP | H04-250632 A | 9/1992 |

(Continued)

OTHER PUBLICATIONS

International Search Report dated Apr. 8, 2014, for corresponding International application No. PCT/JP2014/000960.

(Continued)

*Primary Examiner* — Karen Kusumakar
(74) *Attorney, Agent, or Firm* — Morgan, Lewis & Bockius LLP

(57) ABSTRACT

A semiconductor device including a bipolar transistor in which a polysilicon film is used for an emitter electrode. The bipolar transistor includes a collector region formed in an Si substrate, a base layer formed on the collector region, an emitter region formed in an upper part spaced apart from the collector region of the base layers, and a silicon oxide film formed on the base layer and covering a joint portion of the base layer and the emitter region. The density of fluorine existent at an interface between the joint portion and the silicon oxide film is equal to or higher than $1 \times 10^{20}$ cm$^{-3}$.

12 Claims, 9 Drawing Sheets

(56) References Cited

U.S. PATENT DOCUMENTS

2004/0195655 A1   10/2004   Ohnishi et al.
2007/0105330 A1*  5/2007   Enicks .............. H01L 29/0817
                                                           438/337

FOREIGN PATENT DOCUMENTS

| JP | H10-189470 A | 7/1998 |
| JP | H11-040572 A | 2/1999 |
| JP | 2004-311971 A | 11/2004 |

OTHER PUBLICATIONS

International Preliminary Report on Patentability dated Sep. 1, 2015, for the corresponding International application No. PCT/JP2014/000960.

* cited by examiner

SEMICONDUCTOR DEVICE AND MANUFACTURING METHOD OF THE SAME

TECHNICAL FIELD

The present disclosure relates to a semiconductor device and a manufacturing method of the same, in particular, to a semiconductor device and a manufacturing method of the same, by which variations in an electric current amplification rate β of a bipolar transistor can be further reduced.

BACKGROUND ART

In these years, a bipolar transistor with a polysilicon film used for an emitter electrode is often used in a communication device or the like, for which high speed and high integration are demanded. The structure of the bipolar transistor and the manufacturing method thereof are disclosed in PLT 1, for example.

In addition, the electric current amplification rate β (alternatively, referred to as hFE) is given as a representative characteristic of the bipolar transistor. In general, β is a parameter that fluctuates very easily. As to a reduction in the variation of β (that is, β variation), various studies have been made. For example, PLT 2 discloses a method of reducing the β variations resulting from variations in a natural oxide film thickness, by implanting fluorine (F) ions into a polysilicon film to be an emitter electrode, and further performing heat treatment, so as to break up the natural oxide film existent at a boundary between the polysilicon film and the base layer and to reduce a positive hole reverse injection barrier.

CITATION LIST

Patent Literature

PLT 1: JP 2004-311971 A
PLT 2: JP H11-40572 A

SUMMARY

Technical Problem

In the method as disclosed in PLT 2, however, it is possible to suppress only the β variations resulting from the film thickness variations in the natural oxide film existent at the boundary between the polysilicon film to be the emitter electrode and the base layer.

As illustrated in FIG. 20, when an actual device is manufactured, the interface state (X marks of FIG. 20) existent at an interface between an insulating film 241 and a joint portion of an emitter region 239 and a base region 235 causes the β variations, in not a few cases. This is because variations in the base current are increased due to such an interface state, resulting in an increase in the β variations.

In other words, in the method disclosed in PLT 2, even if fluorine ions are implanted into a polysilicon film 250 to be the emitter electrode, unless the interface state indicated by the X marks can be reduced, the β variations cannot be reduced sufficiently, in some cases. Fluorine is an element which is effective at the termination of an uncombined hand (dangling bond), and which is effective to reduce the interface state. In the ion implantation method as disclosed in PLT 2, however, its purpose is only the breaking up of the natural oxide film, and it is not possible to make high-density fluorine reach the region where the interface state indicated by the X marks exists. Hence, in the method as disclosed in PLT 2, there is a problem that it is not possible to achieve a reduction effect of the β variations sufficiently by reducing the interface state.

Thus, the present disclosure has been made in view of the above circumstances, and has an object to provide a semiconductor device and a manufacturing method of the same, by which the β variations of the bipolar transistor can be further reduced.

Solution to Problem

In order to address the above issue, in one embodiment of the present disclosure, there is provided a semiconductor device, including: a collector region formed in a substrate; a base layer formed on the collector region; an emitter region formed in an upper part of the base layer; an insulating film formed on the base layer to partially cover a joint portion of the base layer and the emitter region; and an emitter electrode made of a polysilicon film formed on the emitter region, wherein a density of halogen existent at an interface between the joint portion and the insulating film is equal to or higher than $1\times10^{20}$ cm$^{-3}$.

In another embodiment of the present disclosure, there is provided a semiconductor device, including: a collector region formed in a substrate; a base layer formed on the collector region; an emitter region formed in an upper part of the base layer; an insulating film formed on the base layer to cover an end region of the emitter region; and an emitter electrode made of a polysilicon film formed on the emitter region, wherein a density of halogen existent at an interface between the end region and the insulating film is equal to or higher than $1\times10^{20}$ cm$^{-3}$.

In yet another embodiment of the present disclosure, there is provided a semiconductor device, including a bipolar transistor in which a polysilicon film is used for an emitter electrode, the bipolar transistor including: a collector region formed in a substrate; a base layer formed on the collector region; an emitter region formed in an upper part of the base layer, the upper part being spaced apart from the collector region; and an insulating film formed on the base layer to partially cover a joint portion of the base layer and the emitter region; wherein a density of halogen existent at an interface between the joint portion and the insulating film is equal to or higher than $1\times10^{20}$ cm$^{-3}$.

In one embodiment of the present disclosure, there is provided a manufacturing method of a semiconductor device including a bipolar transistor, the manufacturing method including: implanting impurities of a first conductivity type into a substrate to form a collector region; forming an impurity layer of a second conductivity type to be a base region on the collector region; forming a silicon oxide film on the impurity layer of the second conductivity type; forming a polysilicon film on the silicon oxide film; doping halogen; after the halogen is doped, etching the polysilicon film and the silicon oxide film to form an opening portion; depositing a polysilicon film to form an emitter electrode in the opening portion; and forming an emitter region in the impurity layer of the second conductivity type.

In another embodiment of the present disclosure, there is provided a manufacturing method of a semiconductor device including a bipolar transistor in which a polysilicon film is used for an emitter electrode, the manufacturing method including: forming a collector region in a substrate; forming a base layer on the collector region; forming a silicon oxide film on the base layer; forming a polysilicon film on the silicon oxide film; ion implanting halogen at a dose of equal to or larger than $1\times10^{15}$ cm$^{-2}$ and equal to or smaller than $1\times10^{16}$ cm$^{-2}$ into the polysilicon film, the silicon oxide film, and the base layer with a peak being set to a vicinity of an interface between the silicon oxide film and the base layer; after the halogen is ion implanted, annealing to segregate the halogen at the interface between the silicon oxide film and the base layer; etching the polysilicon film by using a resist mask; removing the resist mask; wet etching the silicon oxide film by using the polysilicon film as a mask to form an opening portion with the base layer being a bottom face; forming an emitter electrode in the opening portion by depositing a polysilicon film; and forming an emitter region in an upper part of the base layer by introducing an impurity into the base layer through the opening portion, the upper part being spaced apart from the collector region.

Advantageous Effects

In one embodiment of the present disclosure, halogen (for example, fluorine) exists at high density of equal to or higher than $1\times10^{20}$ cm$^{-3}$ at an interface between an insulating film and a joint portion of the base layer and the emitter region. Alternatively, halogen ions are implanted into the polysilicon film, silicon oxide film, and the base layer with the peak being set to the vicinities of the interface at a dose of equal to or larger than $1\times10^{15}$ cm$^{-2}$ and equal to or smaller than $1\times10^{16}$ cm$^{-2}$, so that the halogen can be introduced into the interface at high density of equal to or higher than $1\times10^{20}$ cm$^{-3}$.

Thus, it is possible to terminate the dangling bond existent at the interface with halogen effectively, and to stably reduce the interface state existent at the interface. Accordingly, in the bipolar transistor, it is possible to obtain the β variation reduction effect resulting from the interface state reduction (that is, the interface state is reduced to further reduce the β variations).

DESCRIPTION OF EMBODIMENTS

Figure 1:
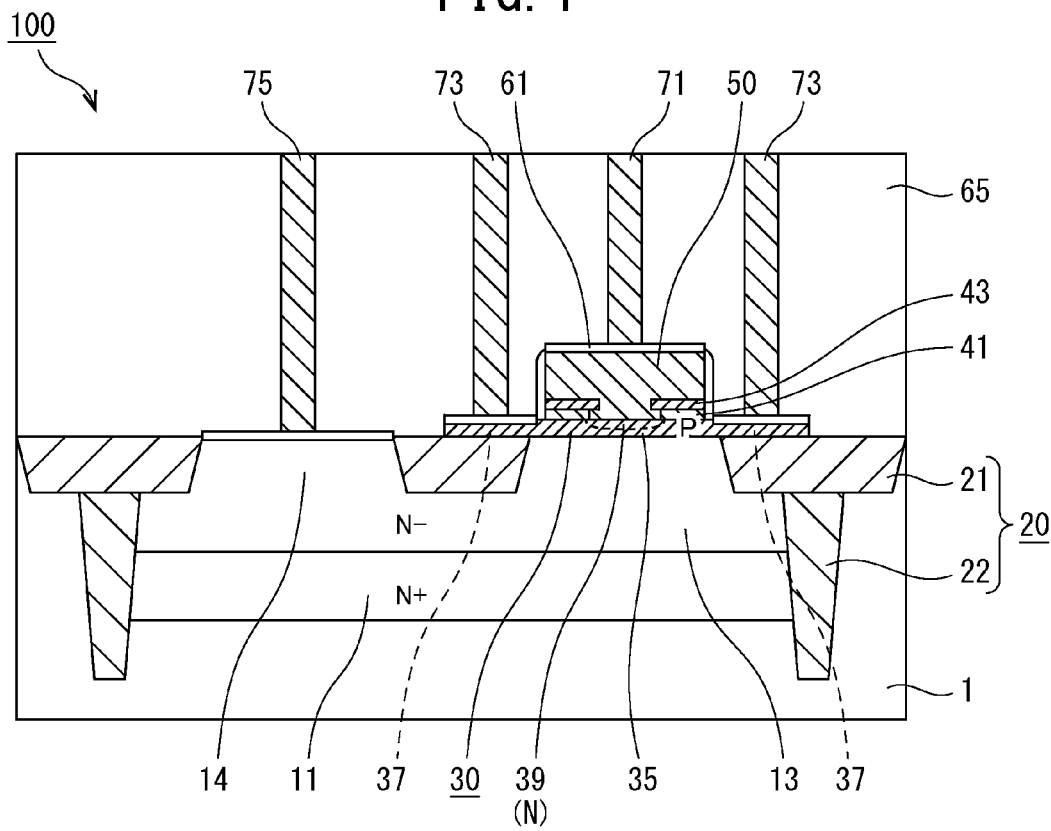
FIG. 1 is a cross-sectional view illustrative of a configuration example of a semiconductor device in one embodiment of the present disclosure.

Hereinafter, embodiments of the present disclosure will be described by using the attached drawings as follows. It is to be noted that in each of the drawings to be described below, same reference numerals are given to the same components having the same functions, and repeated explanations will be omitted.

(Configuration)

FIG. 1 is a cross-sectional view illustrative of a configuration example of a semiconductor device in one embodiment of the present disclosure.

The semiconductor device illustrated in FIG. 1 includes an NPN bipolar transistor 100 having a heterojunction structure in which a polysilicon film is used for an emitter electrode 50.

The NPN bipolar transistor 100 includes N-type collector regions (including a high-density collector region 11 and a low-density collector region 13) formed in a silicon (Si) substrate 1, a P-type base layer 30 formed on the collector region, an N-type emitter region 39 formed in an upper part of the base layer 30, the upper part being spaced apart from the collector regions, and a silicon oxide (SiO$_2$) film 41 formed on the base layer 30.

Figure 7:
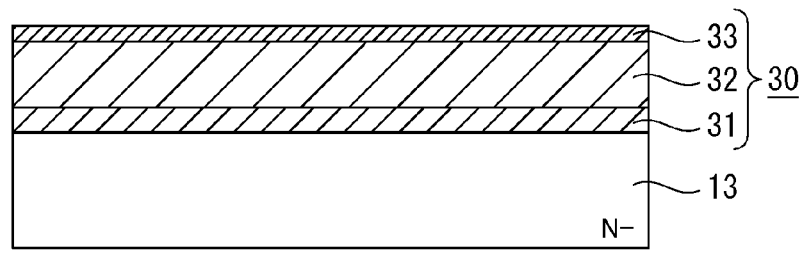
FIG. 7 is a cross-sectional view illustrative of the manufacturing method of the semiconductor device in a process sequence in one embodiment of the present disclosure.

Herein, as illustrated in FIG. 7 to be described later, the base layer 30 is a semiconductor layer of the heterojunction structure, including an Si layer 31, a silicon germanium (SiGe) layer 32 laminated on the Si layer 31, and an Si layer 33 laminated on the SiGe layer 32. An emitter region 39 is formed in the Si layer 33, which is an upper part of the base layer 30. In the base layer 30, a region interposed between the emitter region 39 and the collector region is an effective base region 35 effectively functioning as a base.

Also, in the NPN bipolar transistor 100, a silicon oxide film 41 partially covers a joint portion of the base layer 30 and the emitter region 39. In addition, at an interface between the silicon oxide film 41 and the joint portion of the base layer 30 and the emitter region 39, halogen (for example, fluorine (F)) exists. The density of fluorine at the above interface is, for example, equal to or higher than $1\times10^{20}$ cm$^{-3}$.

Further, in another embodiment of the present disclosure, a silicon oxide film 41 formed on the base layer 30 and an emitter electrode 50 made of a polysilicon film formed on the emitter region 39 are included to cover an end region of the emitter region 39. The density of halogen existent at an interface between the end region and the silicon oxide film 41 is equal to or higher than $1\times10^{20}$ cm$^{-3}$.

Furthermore, the density of halogen that exists at the interface between the base layer 30 and the silicon oxide film 41 is equal to or higher than $1\times10^{20}$ cm$^{-3}$, in one embodiment of the present disclosure.

(Manufacturing Method)

Next, a manufacturing method of the semiconductor device illustrated in FIG. 1 will be described.

FIG. 2 to FIG. 16 are cross-sectional views illustrative of a manufacturing method of the semiconductor device in a process sequence in one embodiment of the present disclosure. It is to be noted that FIG. 15 is a cross-sectional view in which substantial parts are enlarged. Also, here, an NPN bipolar transistor (HBT) having a heterojunction structure with Si/SiGe being used for the base layer will be described as an example. However, the present disclosure is not limited to this structure.

Figure 2:
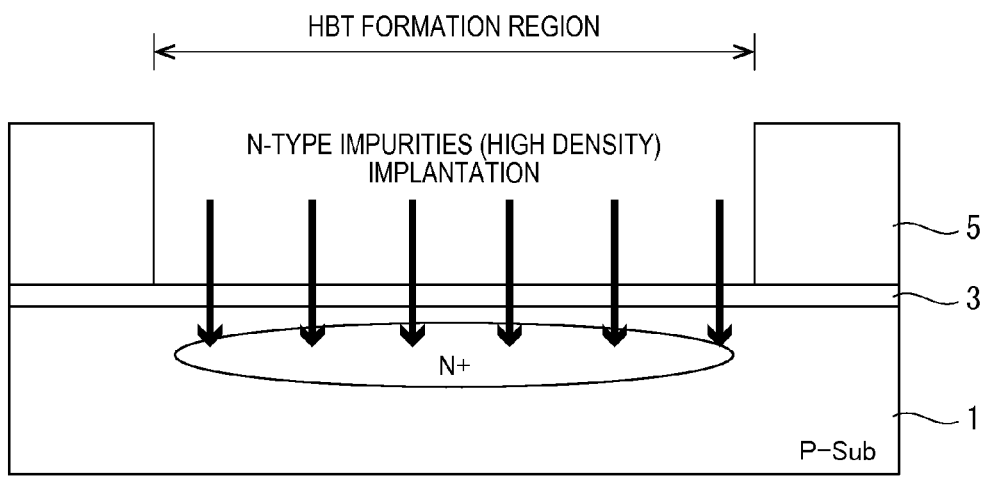
FIG. 2 is a cross-sectional view illustrative of a manufacturing method of the semiconductor device in a process sequence in one embodiment of the present disclosure.

As illustrated in FIG. 2, firstly, a P-type silicon (Si) substrate 1 is prepared. Next, a thermal oxide film 3 having a thickness of about 100 Å is formed in the surface of the Si substrate 1. Then, an upper part of the HBT formation region is opened by lithography to form a photoresist 5 that covers other regions, on the thermal oxide film 3. Then, by using the photoresist 5 as a mask, N-type impurities are ion implanted for high density into the Si substrate 1. In such an ion implantation process, arsenic or phosphorus is used as the N-type impurities. Also, the dose of the ion implantation is about $1\times10^{15}$ cm$^{-2}$ to $1\times10^{16}$ cm$^{-2}$. After this ion implantation, the photoresist 5 is removed. Then, the thermal oxide film 3 is removed by wet etching, so that a single crystal Si layer is epitaxial grown by about 1 μm on the surface of the Si substrate 1.

Figure 3:
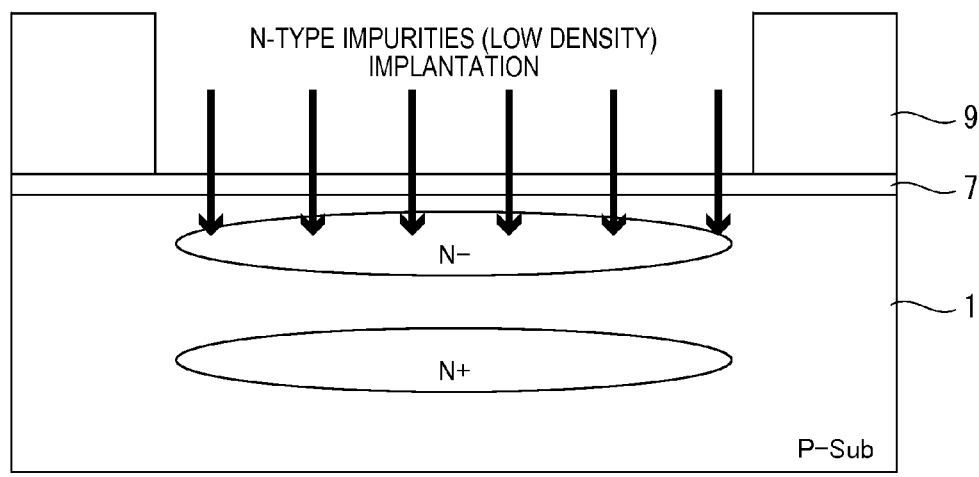
FIG. 3 is a cross-sectional view illustrative of the manufacturing method of the semiconductor device in a process sequence in one embodiment of the present disclosure.

Next, as illustrated in FIG. 3, a thermal oxide film 7 having a thickness of about 100 Å is formed on the surface of the Si substrate 1. Then, an upper part of the HBT formation region is opened by lithography to form a photoresist 9 that covers the other regions. Subsequently, by using the photoresist 9 as a mask, N-type impurities are ion implanted for low density into the Si substrate 1. In such an ion implantation process, arsenic or phosphorus is used as the N-type impurities. Also, the dose of the ion implantation is about $1\times10^{-2}$ cm$^{-2}$ to $1\times10^{13}$ cm$^{-2}$. After the ion implantation, the photoresist 9 is removed.

Then, a thermal treatment at 1000 to 1200° C./60 to 120 min is performed over the whole Si substrate 1 to activate and diffuse the N-type impurities that have been implanted into the Si substrate 1. Hence, as illustrated in FIG. 4, in the Si substrate 1, a high-density collector region (N+ layer) 11 and a low-density collector region (N− layer) 13 located on the high-density collector region 11 are formed.

Figure 4:
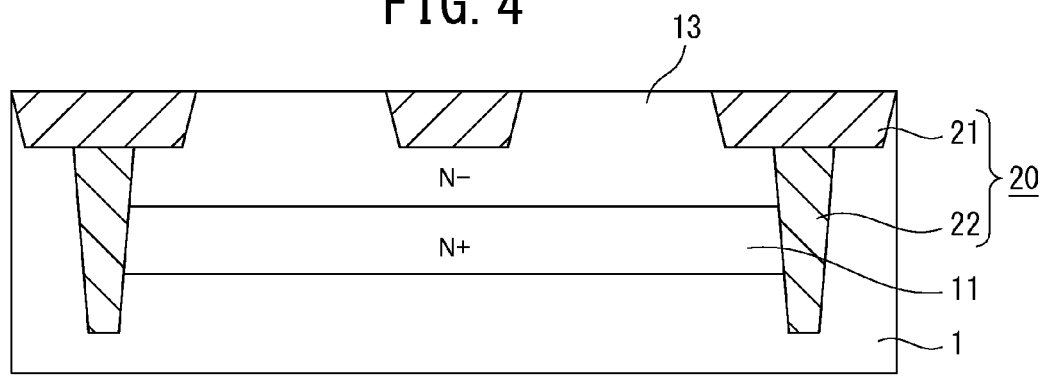
FIG. 4 is a cross-sectional view illustrative of the manufacturing method of the semiconductor device in a process sequence in one embodiment of the present disclosure.

Subsequently, as illustrated in FIG. 4, a deep trench 22 having a depth of about 6 μm is formed as an element isolation layer. The deep trench 22 includes a shallow trench 21 made of a silicon oxide film having a depth of about 0.3 μm, a non-doped polysilicon film, and a silicon oxide film surrounding the non-doped polysilicon film.

Figure 5:
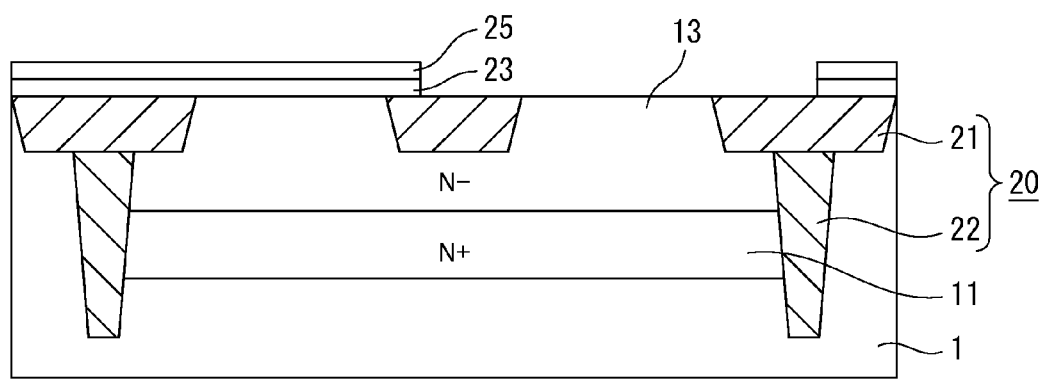
FIG. 5 is a cross-sectional view illustrative of the manufacturing method of the semiconductor device in a process sequence in one embodiment of the present disclosure.

Next, a silicon oxide film having a thickness of 500 Å to 2000 Å and a polysilicon film having a thickness of 500 Å to 2000 Å are deposited on the entire surface above the Si substrate 1 by CVD method, for example. Then, as illustrated in FIG. 5, a polysilicon film 25 and a silicon oxide film 23 are partially removed from the HBT formation region by lithography, dry etching, and wet etching. This partially exposes the surface of the low-density collector region 13.

Figure 6:
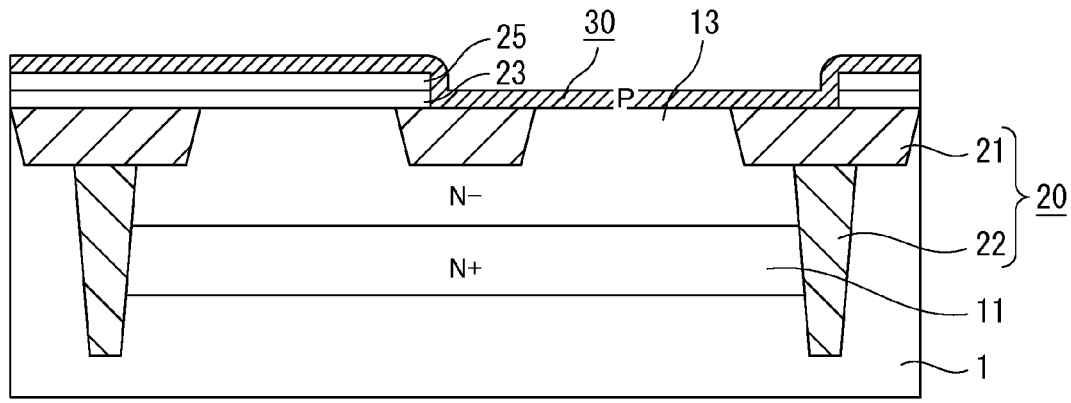
FIG. 6 is a cross-sectional view illustrative of the manufacturing method of the semiconductor device in a process sequence in one embodiment of the present disclosure.
Figure 8:
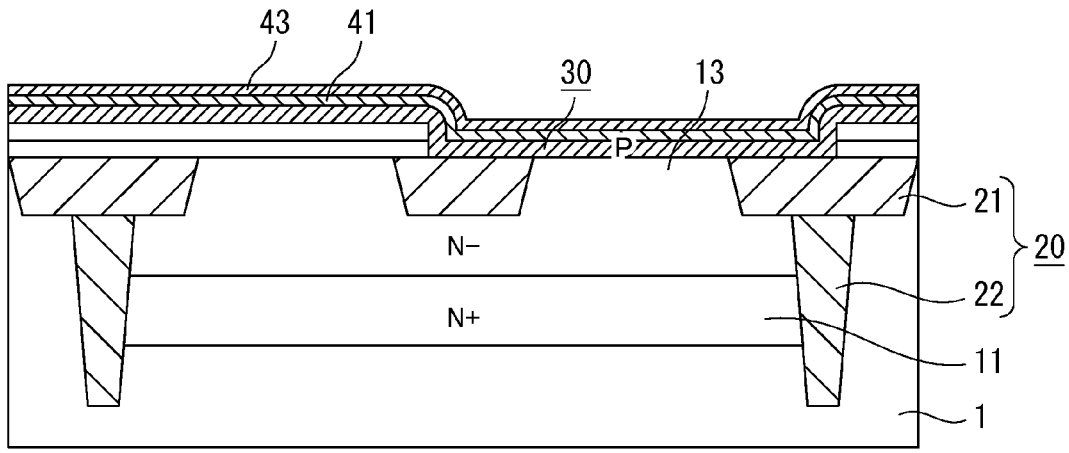
FIG. 8 is a cross-sectional view illustrative of the manufacturing method of the semiconductor device in a process sequence in one embodiment of the present disclosure.

Then, as illustrated in FIG. 6, a base layer 30 is formed above the Si substrate 1. In the forming process of the base layer 30, for example, as illustrated in FIG. 7, the Si layer 31 having a thickness of 50 Å to 300 Å, a silicon germanium (SiGe) layer 32 having a thickness 500 Å to 1000 Å, and the Si layer 33 having a thickness of 50 Å to 300 Å, are epitaxially grown in this order. In this situation, single crystals Si and SiGe grow on the single crystal Si substrate 1. Polycrystal or amorphous Si and SiGe grow on the polysilicon film 25, illustrated in FIG. 6, and a silicon oxide film, not illustrated. In addition, in the forming process of the base layer 30, boron is introduced into the SiGe layer 32 by in-situ doping, for example. Accordingly, the conductive type of the SiGe layer 32 becomes the P type. Next, as illustrated in FIG. 8, a silicon oxide film 41 having a thickness of about 350 Å is formed on the Si substrate 1, and then a polysilicon film 43 having a thickness of about 500 Å is deposited on the silicon oxide film 41. For example, a forming method of the silicon oxide film 41 is a CVD method.

Figure 9:
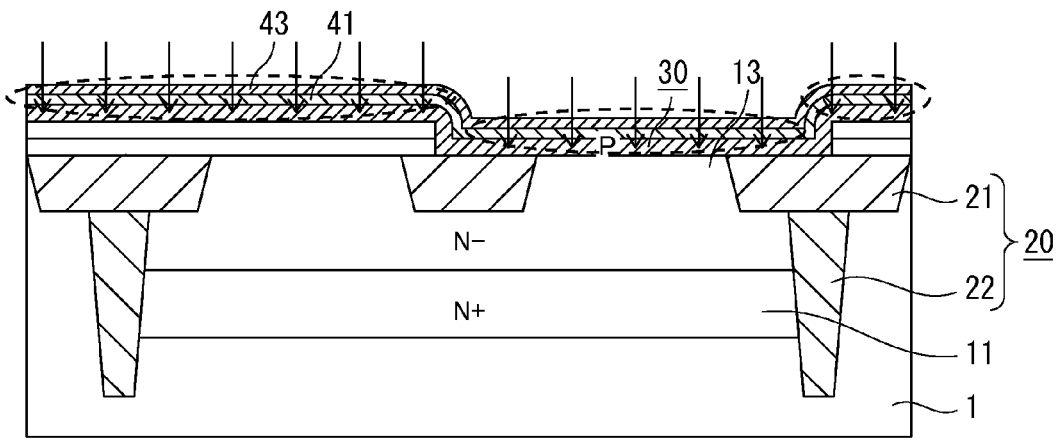
FIG. 9 is a cross-sectional view illustrative of the manufacturing method of the semiconductor device in a process sequence in one embodiment of the present disclosure.

Subsequently, as illustrated in FIG. 9, fluorine is ion implanted at a dose of about $1\times10^{15}$ cm$^{-2}$ to $1\times10^{16}$ cm$^{-2}$. In this ion implantation process, an implantation energy is set such that fluorine should be diffused over the polysilicon film 43, the silicon oxide film 41, and the base layer 30 with the peak being set to vicinities of the interface between the silicon oxide film 41 and the base layer 30 in the HBT formation region.

Figure 10:
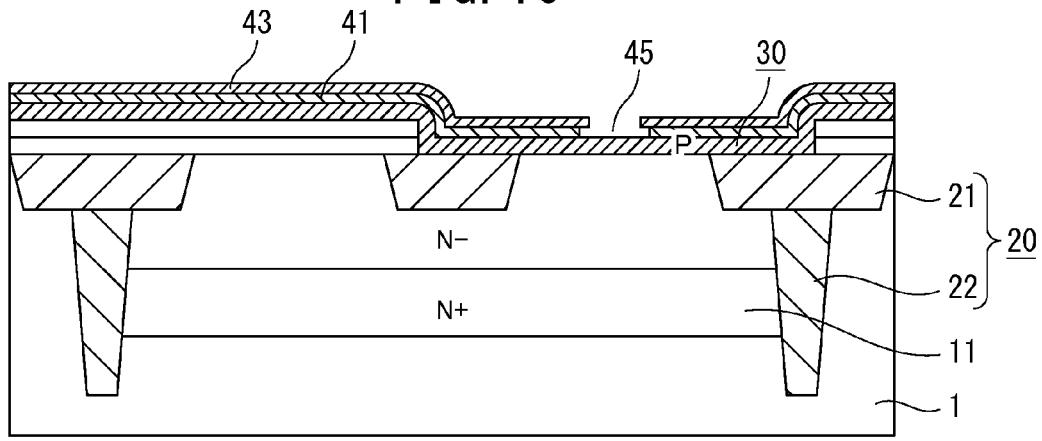
FIG. 10 is a cross-sectional view illustrative of the manufacturing method of the semiconductor device in a process sequence in one embodiment of the present disclosure.

Next, as illustrated in FIG. 10, an opening pattern is formed in the polysilicon film 43 by lithography and dry etching. After the opening pattern is formed, the photoresist, not illustrated, is removed by asking. Then, a silicon oxide film 41 is opened by wet etching by using the polysilicon film 43 having an opening pattern as a mask. Thus, by penetrating through the polysilicon film 43 and the silicon oxide film 41, an opening portion 45 with the base layer 30 being a bottom face is formed in the HBT formation region.

Figure 11:
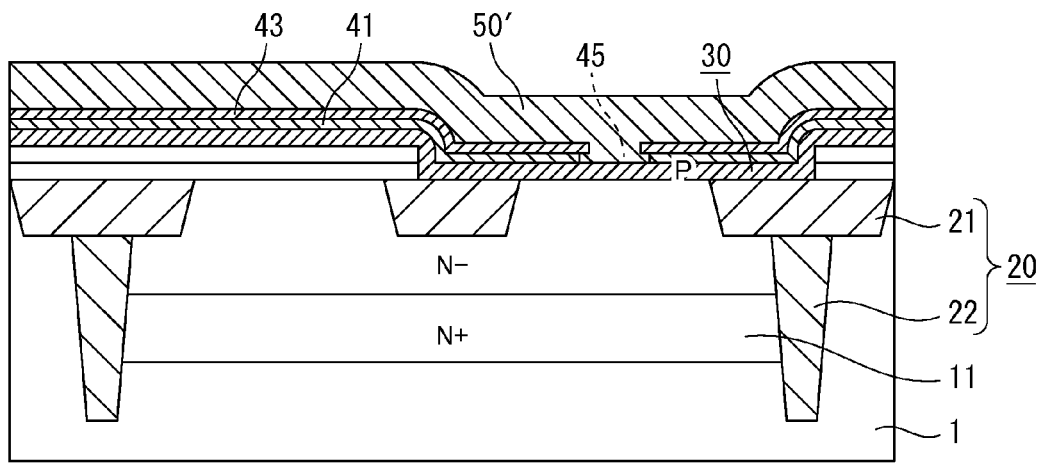
FIG. 11 is a cross-sectional view illustrative of the manufacturing method of the semiconductor device in a process sequence in one embodiment of the present disclosure.

Then, as illustrated in FIG. 11, a non-doped polysilicon film 50' to be an emitter electrode is deposited on the Si substrate 1 by the CVD method or the like to have a thickness of about 2500 Å to be embedded in the opening portion 45. Then, N-type impurities are ion implanted into the polysilicon film 50' that has been deposited. The dose of the ion implantation is about $5\times10^{15}$ cm$^{-2}$ to $1\times10^{16}$ cm$^{-2}$. It is to be noted that instead of the deposition and ion implantation of the non-doped polysilicon film 50', a so-called doped polysilicon film in which phosphorus is in-situ doped may be deposited.

Figure 12:
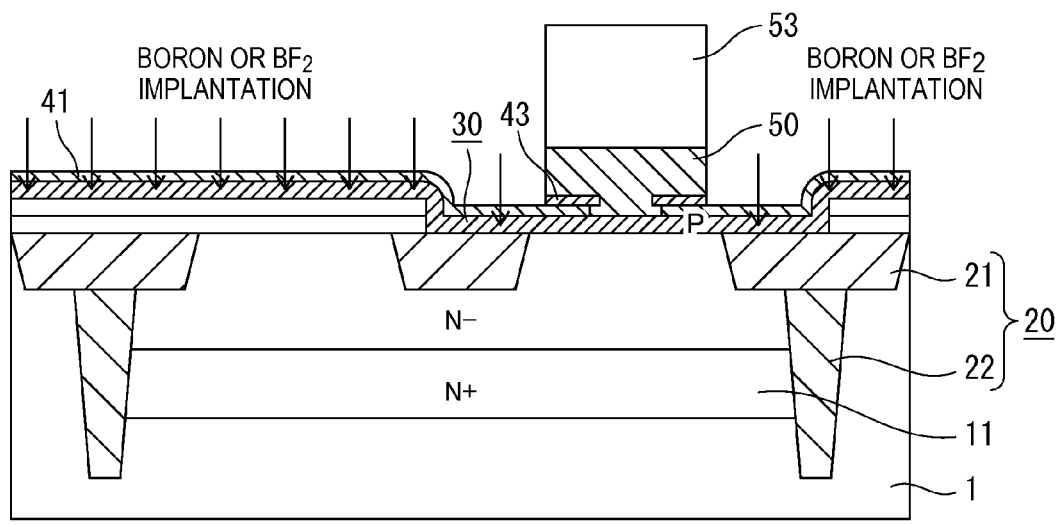
FIG. 12 is a cross-sectional view illustrative of the manufacturing method of the semiconductor device in a process sequence in one embodiment of the present disclosure.

Subsequently, the polysilicon film 50' is patterned by the lithography and dry etching. Accordingly, as illustrated in FIG. 12, the emitter electrode 50 made of the polysilicon film 50' is formed. Subsequently, with the photoresist 53 being left on the emitter electrode 50, boron or BF2 is ion implanted at a dose of about $1\times10^{15}$ cm$^{-2}$ to $1\times10^{16}$ cm$^{-2}$ in a region exposed below the emitter electrode 50 in the base layer 30 in order to reduce the resistance (that is to say, a region to withdraw an effective base region to the outside) of the outer base region. Then, the photoresist 53 is removed from the top of the emitter electrode 50.

Figure 13:
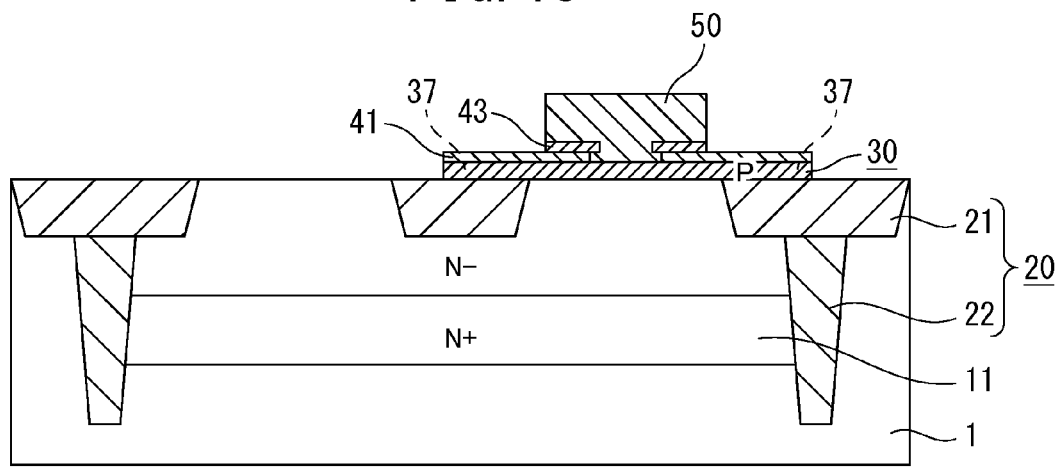
FIG. 13 is a cross-sectional view illustrative of the manufacturing method of the semiconductor device in a process sequence in one embodiment of the present disclosure.

Next, as illustrated in FIG. 13, the base layer 30 is patterned by the lithography and dry etching to form an outer base region 37. Then, the photoresist, not illustrated, that has been used for patterning of the base layer 30 is removed.

Figure 14:
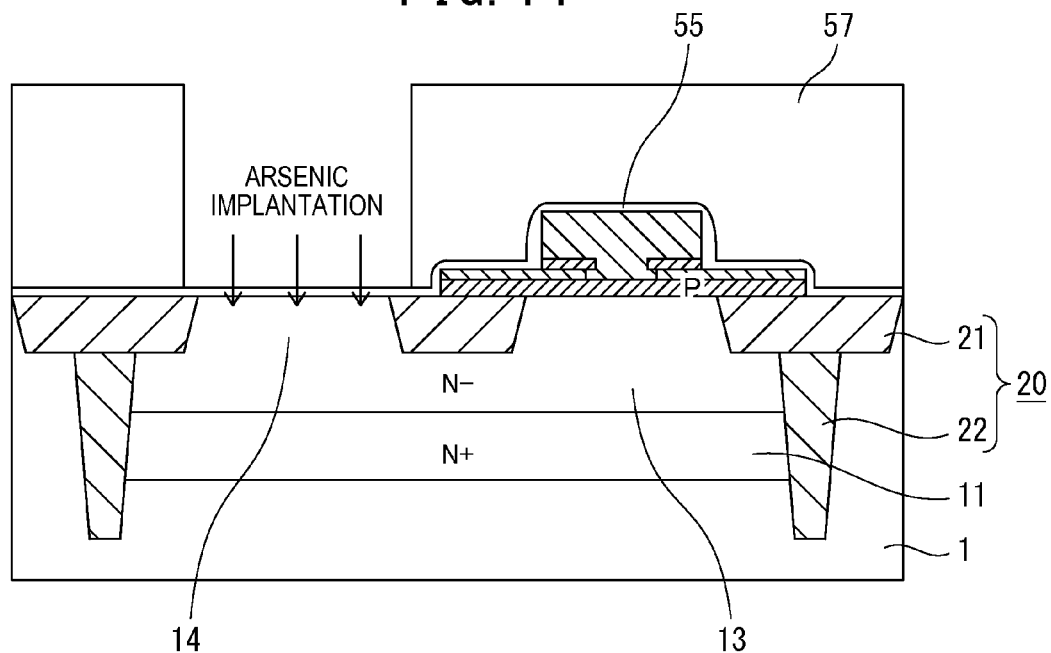
FIG. 14 is a cross-sectional view illustrative of the manufacturing method of the semiconductor device in a process sequence in one embodiment of the present disclosure.
Figure 15:
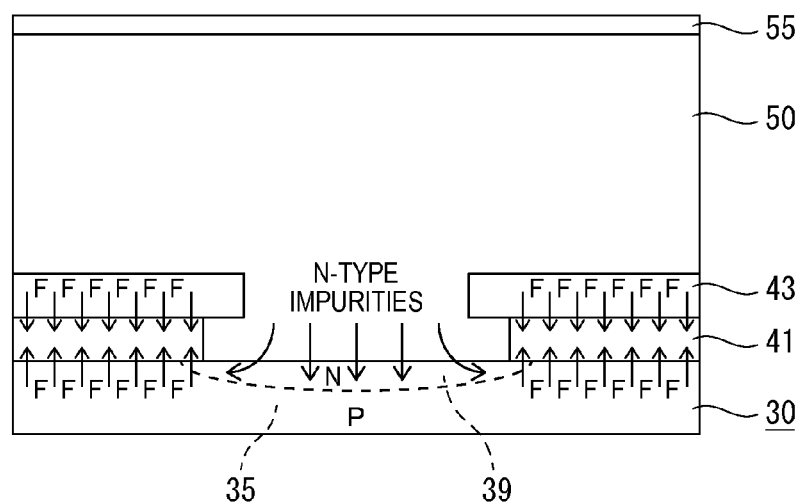
FIG. 15 is a cross-sectional view illustrative of the manufacturing method of the semiconductor device in a process sequence in one embodiment of the present disclosure.

Then, as illustrated in FIG. 14, a silicon oxide film 55 having a thickness of about 100 Å is formed above the Si substrate 1. Then, the upper part of a contact region (that is to say, collector contact region) 14 of the low-density collector region 13 is opened by the lithography, and a photoresist 57 that covers the other regions is formed. Next, by using the photoresist 57 as a mask, arsenic ions are implanted at a dose of about $1\times10^{15}$ cm$^{-2}$ to $5\times10^{15}$ cm$^{-2}$. After that, the photoresist 57 is removed.

Next, the whole Si substrate 1 is annealed at temperature of about 950 to 1050° C./10 to 60 sec. Accordingly, as illustrated in FIG. 15, N-type impurities included in the emitter electrode 50 made of a polysilicon film is diffused from the emitter electrode 50 to the base layer 30 side, so that an emitter region 39 is formed in an upper part (for example, an Si layer 33 illustrated in FIG. 7) spaced apart from the low-density collector region of the base layer 30.

In this situation, since fluorine which is distributed in the polysilicon film 43, the silicon oxide film 41, and the base layer 30 is mostly taken into the silicon oxide film 41 and the interface between the silicon oxide film 41 and the base layer 30, fluorine can be distributed at the interface between the silicon oxide film 41 and the base layer 30. This is because the segregation coefficient of Si/SiO$_2$ interface of fluorine is about $5.6\times10^{-8}$ and the equilibrium state is a state where the density rates of fluorine at the Si/SiO$_2$ interface are different by eight digits (in other words, the density of fluorine in SiO$_2$ is higher by eight digits than the density of the fluorine in Si).

Figure 16:
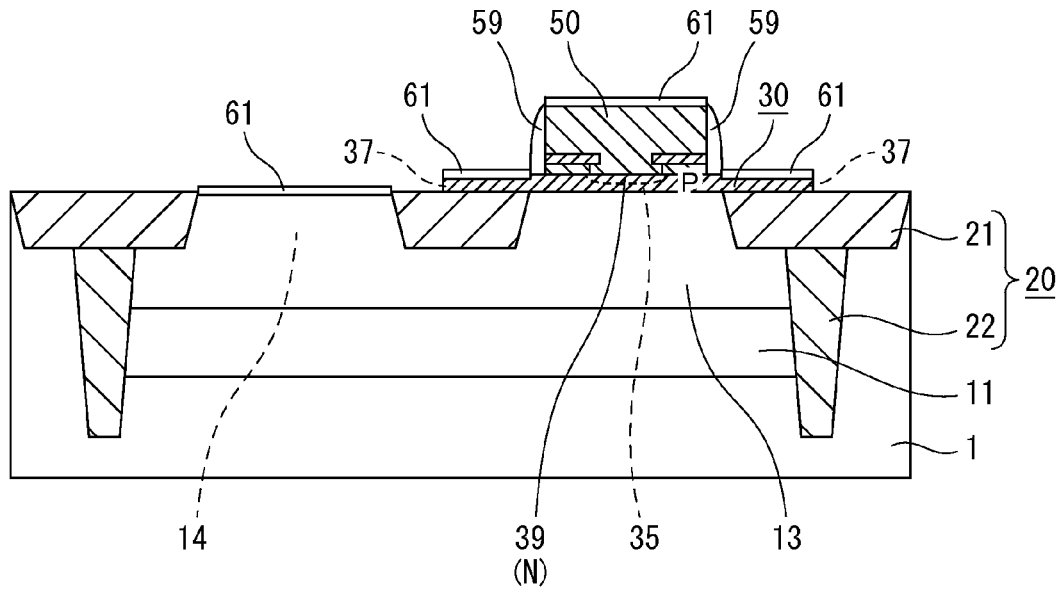
FIG. 16 is a cross-sectional view illustrative of the manufacturing method of the semiconductor device in a process sequence in one embodiment of the present disclosure.

Next, a silicon oxide film is deposited by about 300 Å, and subsequently, the silicon oxide film is anisotropically etched back. Thus, as illustrated in FIG. 16, side walls 59 are formed in side walls of the polysilicon film 50.

Then, a CoSi layer 61 is formed by self-aligned silicide respectively on a surface to which the low-density collector region 13 is exposed, a surface to which the emitter electrode 50 is exposed, and a surface to which the outer base region 37 is exposed. In subsequent processes, a standard multi-layer wiring process is used to electrically connect the respective elements. That is to say, as illustrated in FIG. 1, an interlayer insulating film 65 is formed, contact halls having the CoSi layer 61 as a bottom face is formed by penetrating through the interlayer insulating film 65, and electrode materials are embedded in the contact halls, respectively. Accordingly, an emitter contact portion 71 electrically connected to the emitter electrode 50, a base contact portion 73 electrically connected to the outer base region 37, and a collector contact portion 75 electrically connected to the low-density collector region 13 are formed.

Through the above-mentioned processes, the NPN bipolar transistor 100 having the heterojunction structure in which the β variations are reduced is completed.

In one embodiment of the present disclosure, the high-density collector region 11 and the low-density collector region 13 correspond to a collector region in one embodiment of the present disclosure. In addition, the silicon oxide film 41 corresponds to an insulating film in one embodiment of the present disclosure. Further, fluorine corresponds to halogen in one embodiment of the present disclosure, and the NPN bipolar transistor 100 having the heterojunction structure corresponds to a bipolar transistor in one embodiment of the present disclosure.

Effects of Embodiments

Embodiments of the present disclosure bring out the following effects.

(1) Fluorine exists at high density equal to or higher than $1\times10^{20}$ cm$^{-3}$ at an interface between the silicon oxide film 41 and a joint portion of the base layer 30 and the emitter region 39. Alternatively, by implanting fluorine ions into the polysilicon film 43, the silicon oxide film 41, and the base layer 30 at a dose of equal to or larger than $1\times10^{15}$ cm$^{-2}$ and equal to or smaller than $1\times10^{16}$ cm$^{-2}$, fluorine can be introduced into the interface at high density equal to or higher than $1\times10^{20}$ cm$^{-3}$.

Therefore, the dangling bond existent at the interface can be terminated with fluorine effectively, so that the interface state existent at the interface can be reduced sufficiently and stably. Thus, in the bipolar transistor, a reduction effect in the β variations due to the interface state reduction is sufficiently obtainable (that is, the interface state is reduced and the β variations are further reduced).

That is to say, in the bipolar transistor in which the polysilicon film is used for the emitter electrode, a natural oxide film existent at the boundary between the polysilicon film and the base layer is broken up and halogen such as fluorine is diffused at a density of equal to or higher than $1\times10^{20}$ cm$^{-3}$ in a region corresponding to the interface between the insulating film and the joint portion of the emitter region and the base region. It is to be noted that the reason why the natural oxide film existent at the boundary between the polysilicon film and the base layer can be broken up is that as fluorine is also implanted into the base layer in one embodiment of the present disclosure, fluorine can be naturally introduced into the boundary between the polysilicon film and the base layer.

Accordingly, it is possible to achieve the bipolar transistor in which the β variations are suppressed by reducing the interface state existent at the interface.

(2) In addition, the base layer 30 includes the SiGe layer 32 and the Si layer 33 laminated on the SiGe layer 32. That is to say, the base layer 30 is an SiGe/Si layer. Accordingly, the bipolar transistor of the heterojunction structure can be configured. A base current Ib can be made smaller than that of a bipolar transistor of a homojunction structure, and therefore, β can be increased.

(Modifications)

(1) In the above-described embodiments, the descriptions have been given of a case where the halogen existing (or is introduced) at the interface between the silicon oxide film 41 and the joint portion of the base layer 30 and the emitter region 39 is fluorine. In the present disclosure, however, the above-described halogen is not limited to fluorine. Halogen, for example, may be any one of chlorine (Cl), bromine (Br), or iodine (I). Even in such a case, similar effects to the effects (1) and (2) in the above-described embodiments are brought out.

(2) In addition, in the above-described embodiments, the descriptions have been given of a case where the bipolar transistor in the present disclosure is an NPN bipolar transistor of a heterojunction structure. In the present disclosure, however, the above-described bipolar transistor is not limited to this.

For example, the bipolar transistor in the present disclosure may be a PNP bipolar transistor of a heterojunction structure. In such a case, in the above-described embodiments, the conductive type of impurities included in each semiconductor layer may be replaced such that the N type should be replaced with the P type and the N type should be replaced with the P type. Even in such a case, similar effects to the effects (1) and (2) in the above-described embodiments are brought out.

Alternatively, the bipolar transistor in the present disclosure may have a homojunction structure. In such a case, for example, a base layer is not SiGe/Si, but is configured with Si only. In such a case, a similar effect to the effect (1) in the above-described embodiments is brought out.

(3) Further, in the above-described embodiments, a manufacturing method of using the polysilicon film 43 as a hard mask to open the silicon oxide film 41 has been described. However, without the use of the polysilicon film 43, another manufacturing method may be applicable such that a resist pattern is formed directly on the silicon oxide film 41, so that the silicon oxide film 41 is opened, and then the resist pattern is removed. However, in such a case, after the opening portion 45 having the base layer 30 as a bottom face is formed, a resist removal process is necessary. Hence, there arises another problem that the base layer 30 that is the bottom face of the opening portion 45 is damaged, the interface state between the emitter electrode 50 and the base layer 30 deteriorates and an HBT characteristic deteriorates. Accordingly, it is not possible to obtain the effects of the β variation reduction similar to those in the manufacturing method used in the above-described embodiments in which the silicon oxide film 41 is opened with the polysilicon film 43 being used as a hard mask.

(4) Furthermore, in the above-described embodiments, fluorine is implanted immediately after the silicon oxide film 41 and the polysilicon film 43 are formed. However, another manufacturing method may be conceivable such that fluorine is implanted immediately after the silicon oxide film. 41 is formed or the emitter opening portion 45 is formed.

It is to be noted that when fluorine is implanted immediately after the silicon oxide film 41 is formed, as the silicon oxide film 41 is comparatively thin, it is difficult to control a peak of fluorine in the ion implantation to the vicinities of the interface between the silicon oxide film 41 and the base layer 30, in some cases.

Besides, when fluorine is implanted immediately after the emitter opening portion 45 is formed, as the surface of the base layer 30 is exposed, there arises another problem that the base layer 30 is damaged by a high-dose ion implantation of fluorine, the interface state between the emitter electrode 50 and the base layer 30 deteriorates, and an HBT characteristic deteriorates. Thus, the manufacturing method of implanting the fluorine ions immediately after the polysilicon film 43 is formed is applicable, as described in the above-described embodiments.

(Measuring Method)

In one embodiment of the present disclosure, as a measuring method of F density in the bipolar transistor, an analytical technique, such as EELS, TEM-EXD, a three-dimensional atom probe (3DAP) can be used for measurement.

Comparative Example

As a comparative example in the present disclosure, there is a case where the method disclosed in PLT 2, that is fluorine ions are implanted into the polysilicon film 150 and then a thermal treatment is conducted, in the manufacturing method of the bipolar transistor in which the polysilicon film is used for the emitter electrode.

Figure 17:
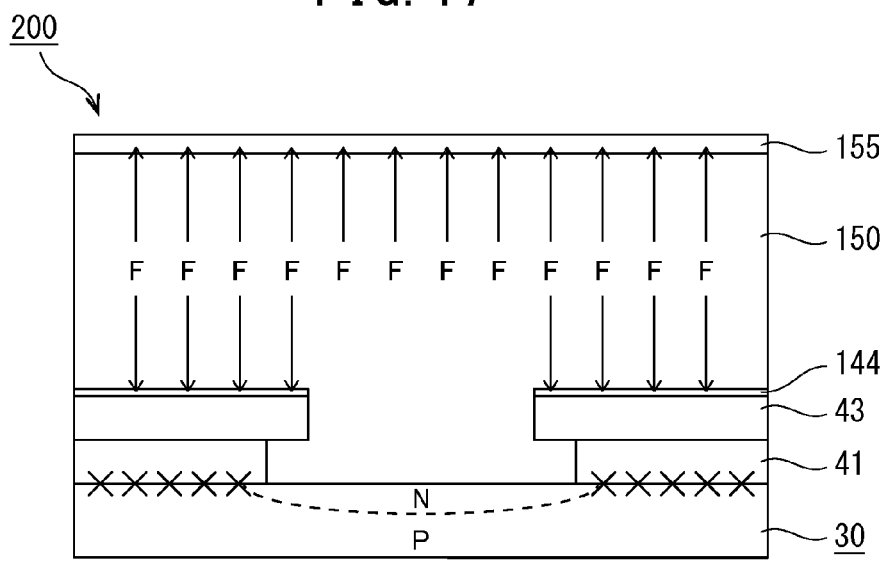
FIG. 17 is a cross-sectional view illustrative of a configuration example of a bipolar transistor in a comparative example.

As illustrated in FIG. 17, in a comparative example, fluorine is mainly taken into the silicon oxide film 155 existent in an upper layer of the polysilicon film 150 or the natural oxide film 144 existent between the polysilicon film 150 and the polysilicon film 43. For this reason, unlike the above-described embodiments of the present disclosure, fluorine of high density equal to or higher than $1 \times 10^{20}$ cm$^{-3}$ cannot be introduced into the interface between the silicon oxide film 41 and the base layer 30, in the comparative example. Therefore, it is not possible to terminate the dangling bond (X marks of FIG. 17) with fluorine effectively, and the interface state causing the β variations cannot be reduced sufficiently.

Even if the silicon oxide film is not positively formed at the upper layer of the polysilicon film 150 or between the polysilicon film 150 and the polysilicon film 43, the natural oxide film 144 of several Å is formed by all means by being exposed to the air. Hence, in the comparative example, it is not possible to avoid the problem to be solved by the present disclosure. This inventor of the present disclosure has conducted the following inspection with respect to the above issue.

(Inspection)

Figure 18:
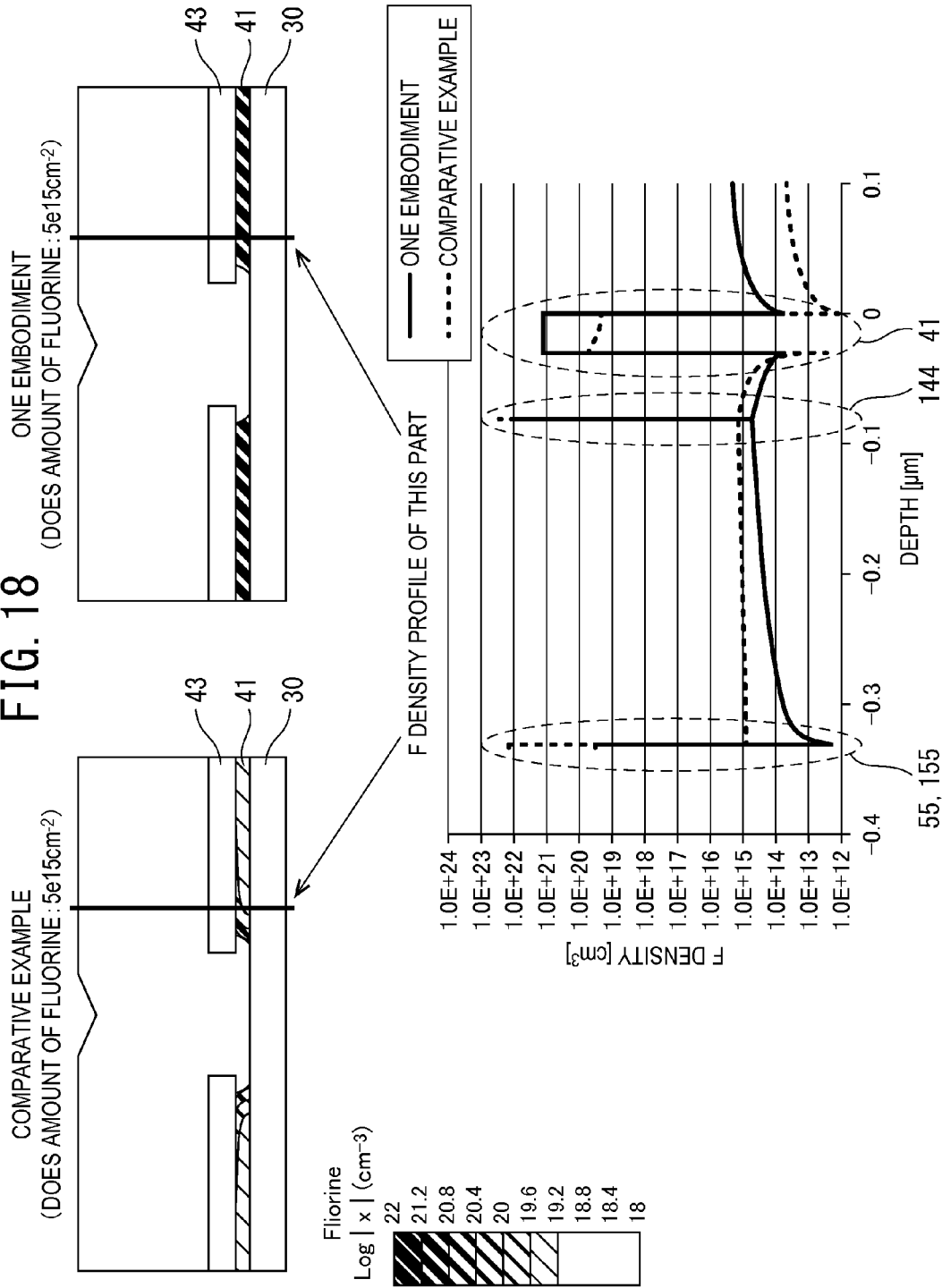
FIG. 18 is a view illustrative of a simulation result that has been performed by the inventor of the present disclosure.

FIG. 18 is a view illustrative of simulation results of comparing a fluorine density distribution in the bipolar transistor 100 in one embodiment of the present disclosure (that is, the bipolar transistor, as illustrated in FIG. 9, which is formed by implanting the fluorine ions into the polysilicon film 43, the silicon oxide film 41, and the base layer 30) with a fluorine density distribution in the bipolar transistor 200 in the comparative example (that is, the bipolar transistor, as illustrated in FIG. 17, which is formed by implanting the fluorine ions into the polysilicon film 150). It is to be noted that the fluorine density distributions illustrated by graphs of FIG. 18 (that is, the F density profiles) are respective simulation values of a bold line of the cross-sectional view in one embodiment of the present disclosure and a bold line of the cross-sectional view in the comparative example.

As illustrated in FIG. 18, as compared with the comparative example, what has been confirmed is that fluorine having a density equal to or higher by one digit can be introduced into the interface between the silicon oxide film 41 and the base layer 30, in one embodiment of the present disclosure. It is to be noted that in this simulation, in both of one embodiment of the present disclosure and the comparative example, the dose of the fluorine is set to $5 \times 10^{15}$ cm$^{-2}$, the thickness of the silicon oxide films 55 and 155 in the upper layer of the polysilicon films 50 and 150 is set to 20 Å, respectively, and the thickness of the natural oxide film between the polysilicon films 50, 150 and the polysilicon film 43 is set to 5 Å.

Figure 19:
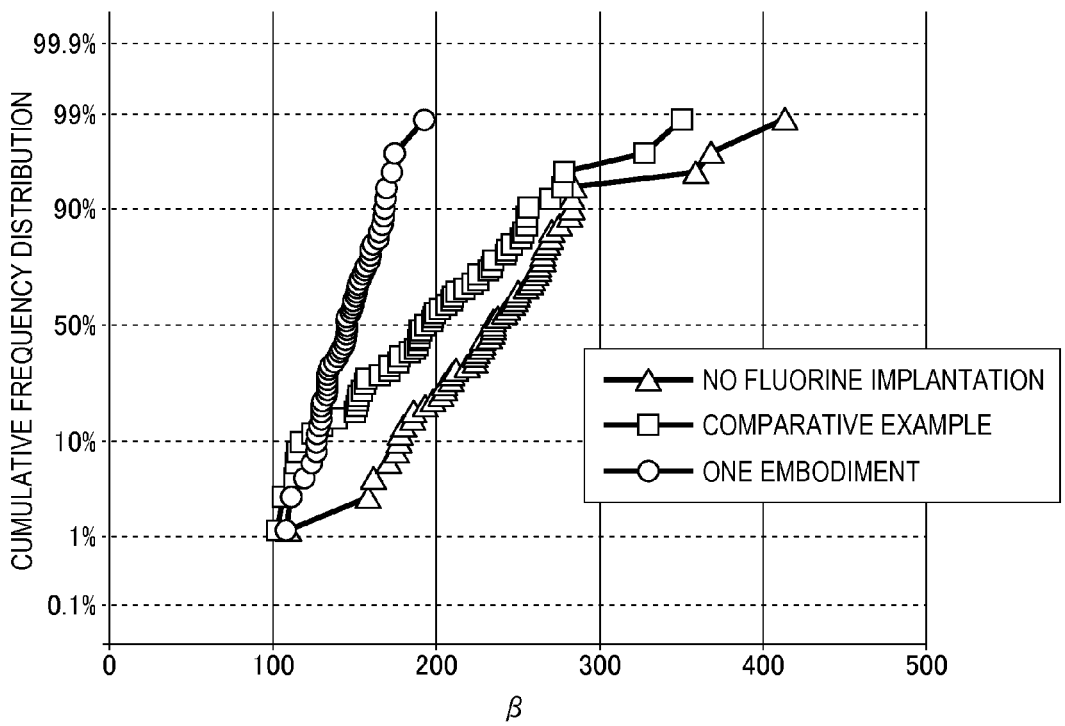
FIG. 19 is a view illustrative of an actual experiment result that has been performed by the inventor of the present disclosure.
Figure 20:
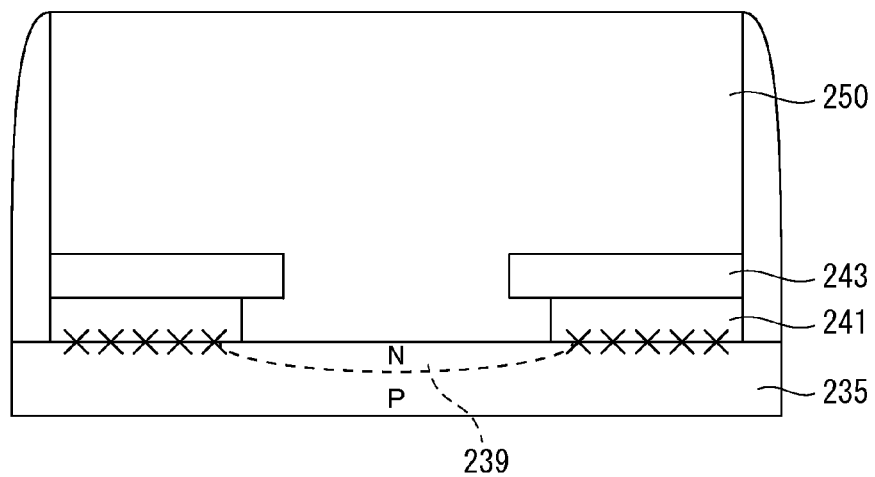
FIG. 20 is a cross-sectional view illustrative of a problem.

FIG. 19 is a view illustrative of actual experiment results of comparing in-plane β variations of eight-inch wafer among the bipolar transistor 100 in one embodiment of the present disclosure, the bipolar transistor 200 in the comparative example, and a case where fluorine is not implanted in a similar configuration to the bipolar transistors 100 and 200. The horizontal axis of FIG. 19 represents an electric current amplification factor β, and the vertical axis represents a cumulative frequency.

As illustrated in FIG. 19, by comparing one embodiment of the present disclosure, the comparative example, and the case where fluorine is not implanted, it has been confirmed that the β variations are the smallest in one embodiment of the present disclosure. That is to say, it has been confirmed that the bipolar transistor of the small β variations can be achieved, in one embodiment of the present disclosure. It is to be noted that in this experiment, the dose of fluorine is set to $5 \times 10^{15}$ cm$^{-2}$ in both of one embodiment of the present disclosure and the comparative example.

(Others)

The present disclosure is not limited to the above-described embodiments. It would be appreciated that changes or variations in design may be made in the above-described embodiments based on the knowledge of those skilled in the art, and such changes or variations may be included in the scope of the present disclosure.

REFERENCE SIGNS LIST 1 substrate
3, 7 thermal oxide film 5, 9, 53, 57 photoresist
11 high-density collector region
13 low-density collector region
14 collector contact region
23, 41, 55 silicon oxide ($SiO_2$) film
21 shallow trench
22 deep trench
25, 43 polysilicon film
30 base layer
31, 33 Si layer
32 SiGe layer
35 effective base region
37 outer base region
39 emitter region
45 opening portion
50 emitter electrode
50' polysilicon film
59 side wall
61 CoSi layer
65 interlayer insulating film
71 emitter contact portion
73 base contact portion
75 collector contact portion
100 NPN bipolar transistor of heterojunction structure

The invention claimed is:

1. A semiconductor device, comprising:
a collector region formed in a substrate;
a base layer formed on the collector region;
an emitter region formed in an upper part of the base layer;
an insulating film formed on the base layer to partially cover a joint portion of the base layer and the emitter region; and
an emitter electrode made of a polysilicon film formed on the emitter region,
wherein a density of halogen existent at an interface between the joint portion and the insulating film is equal to or higher than $1 \times 10^{20}$ cm$^{-3}$.

2. A semiconductor device, comprising:
a collector region formed in a substrate;
a base layer formed on the collector region;
an emitter region formed in an upper part of the base layer;
an insulating film formed on the base layer to cover an end region of the emitter region; and
an emitter electrode made of a polysilicon film formed on the emitter region,
wherein a density of halogen existent at an interface between the end region and the insulating film is equal to or higher than $1 \times 10^{20}$ cm$^{-3}$.

3. A semiconductor device, comprising a bipolar transistor in which a polysilicon film is used for an emitter electrode,
the bipolar transistor comprising:
a collector region formed in a substrate;
a base layer formed on the collector region;
an emitter region formed in an upper part of the base layer, the upper part being spaced apart from the collector region; and
an insulating film formed on the base layer to partially cover a joint portion of the base layer and the emitter region;
wherein a density of halogen existent at an interface between the joint portion and the insulating film is equal to or higher than $1 \times 10^{20}$ cm$^{-3}$.

4. The semiconductor device according to claim 1, wherein the density of the halogen existent at a location deeper than the interface between the joint portion and the insulating film is equal to or higher than $1 \times 10^{14}$ cm$^{-3}$.

5. The semiconductor device according to claim 1, wherein the base layer either includes a silicon germanium layer and a silicon layer laminated on the silicon germanium layer, or includes a silicon layer only.

6. The semiconductor device according to claim 1, wherein the density of an interface between the base layer and the insulating film is equal to or higher than $1 \times 10^{20}$ cm$^{-3}$.

7. A manufacturing method of a semiconductor device including a bipolar transistor, the manufacturing method comprising:
implanting impurities of a first conductivity type into a substrate to form a collector region;
forming an impurity layer of a second conductivity type to be a base region on the collector region;
forming a silicon oxide film on the impurity layer of the second conductivity type;
forming a polysilicon film on the silicon oxide film;
doping halogen;
after the halogen is doped, etching the polysilicon film and the silicon oxide film to form an opening portion;
depositing a polysilicon film to form an emitter electrode in the opening portion; and
forming an emitter region in the impurity layer of the second conductivity type.

8. The manufacturing method according to claim 7, wherein in the step of doping the halogen, after halogen is ion implanted at a dose of equal to or larger than $1 \times 10^{15}$ cm$^{-2}$ and equal to or smaller than $1 \times 10^{16}$ cm$^{-2}$ with a peak being set to a vicinity of an interface between the silicon oxide film and the impurity layer of the second conductivity type, an anneal process is conducted.

9. A manufacturing method of a semiconductor device including a bipolar transistor in which a polysilicon film is used for an emitter electrode,
the manufacturing method comprising:
forming a collector region in a substrate;
forming a base layer on the collector region;
forming a silicon oxide film on the base layer;
forming a polysilicon film on the silicon oxide film;
ion implanting halogen at a dose of equal to or larger than $1 \times 10^{15}$ cm$^{-2}$ and equal to or smaller than $1 \times 10^{16}$ cm$^{-2}$ into the polysilicon film, the silicon oxide film, and the base layer with a peak being set to a vicinity of an interface between the silicon oxide film and the base layer;
after the halogen is ion implanted, annealing to segregate the halogen at the interface between the silicon oxide film and the base layer;
etching the polysilicon film by using a resist mask;
removing the resist mask;
wet etching the silicon oxide film by using the polysilicon film as a mask to form an opening portion with the base layer being a bottom face;
forming an emitter electrode in the opening portion by depositing a polysilicon film; and
forming an emitter region in an upper part of the base layer by introducing an impurity into the base layer through the opening portion, the upper part being spaced apart from the collector region.

10. The manufacturing method according to claim 9, wherein the base layer either includes a silicon germanium layer and a silicon layer laminated on the silicon germanium layer, or includes a silicon layer only.

11. The manufacturing method according to claim 9, wherein in the step of forming the emitter electrode in the opening portion, after the polysilicon film is deposited, an impurity of a first conductivity type is implanted, and wherein in the step of forming the emitter region, an emitter region is formed in the base layer by annealing.

12. The manufacturing method according to claim 9,
wherein in the step of forming the emitter electrode in the opening region, the deposited polysilicon film is a doped polysilicon film including the impurity of the first conductivity type, and
wherein in the step of forming the emitter region, the emitter region is formed in the base layer by annealing.

* * * * *